United States Patent
Boll et al.

(10) Patent No.: US 6,229,327 B1
(45) Date of Patent: May 8, 2001

(54) BROADBAND IMPEDANCE MATCHING PROBE

(76) Inventors: Gregory G. Boll, 2720 Coach House La.; Harry J. Boll, 2780 70th St. SW., both of Naples, FL (US) 34105

( * ) Notice: Subject to any disclaimer, the term of this patent is extended or adjusted under 35 U.S.C. 154(b) by 0 days.

(21) Appl. No.: 08/866,081

(22) Filed: May 30, 1997

(51) Int. Cl.[7] .................................................. G01R 31/02
(52) U.S. Cl. ............................................ 324/762; 324/761
(58) Field of Search .................................... 324/754, 761, 324/762, 765, 95; 333/32, 33, 34

(56) References Cited

U.S. PATENT DOCUMENTS

| | | | | |
|---|---|---|---|---|
| 1,921,117 | * | 8/1933 | Darbord | 250/250 |
| 2,438,915 | * | 4/1948 | Hansen | 333/22 R |
| 3,209,287 | * | 9/1965 | Oxner et al. | 333/34 |
| 5,168,538 | * | 12/1992 | Gillespie | 385/123 |
| 5,432,450 | * | 7/1995 | Rubinson | 324/318 |
| 5,565,788 | * | 10/1996 | Burr et al. | 324/762 |

OTHER PUBLICATIONS

The Radio Engineer's Handbook by Terman McGraw–Hill, 1943 pp. 206 215 (Month Unavailable).
Radio Engineering (third edition) by Terman McGraw–Hill, 1947 pp. 100 to104 (Month Unavailable).
ARRL Antenna, published by the American Relay League Newington, CT, 1994 (Month Unavailable).

* cited by examiner

Primary Examiner—Josie Ballato
Assistant Examiner—Russell M. Kobert
(74) Attorney, Agent, or Firm—Werner H. Schroeder

(57) ABSTRACT

A probe for testing integrated circuits at microwave frequencies employs a tapered coaxial transmission line to transform the impedance at the probe tips to the impedance of the test instruments. Mechanically resilient probe tip structures allow reliable probing of non-planar circuits and the elastic probe body allows large overprobing without damage to the test circuit. Novel insulator structures for the coaxial line allow easy and accurate assembly and high performance.

17 Claims, 5 Drawing Sheets

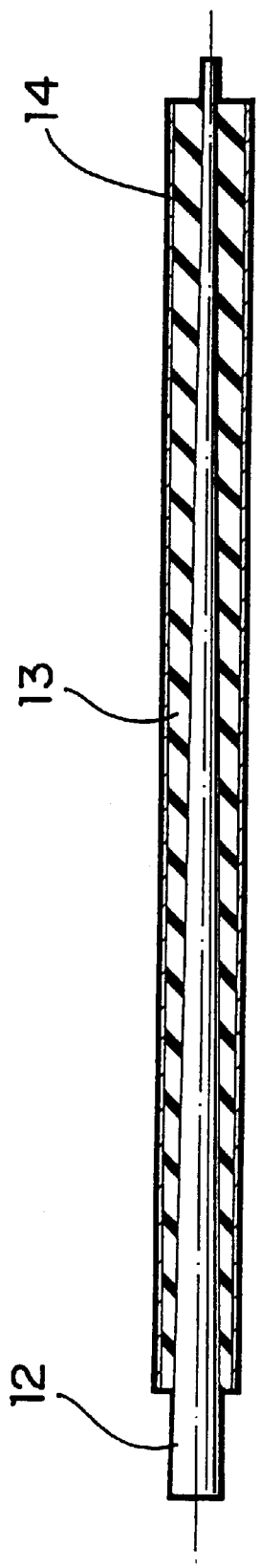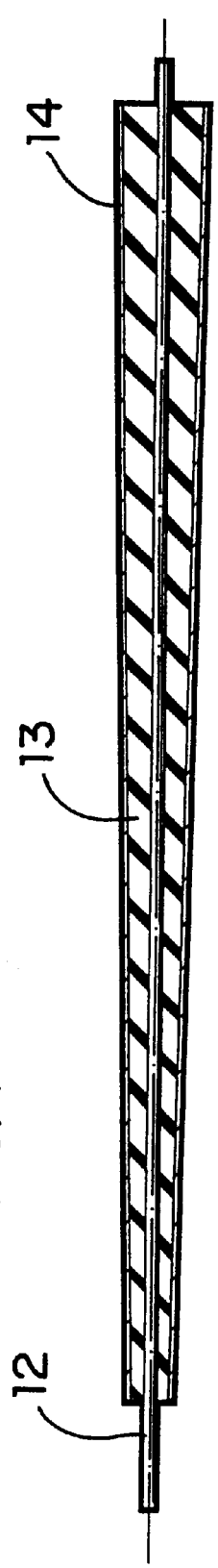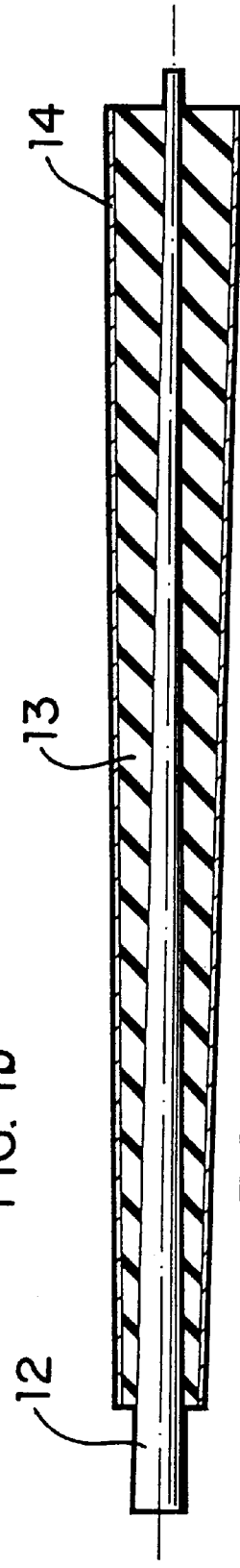
FIG. 1a  FIG. 1b  FIG. 1c
FIG. 1

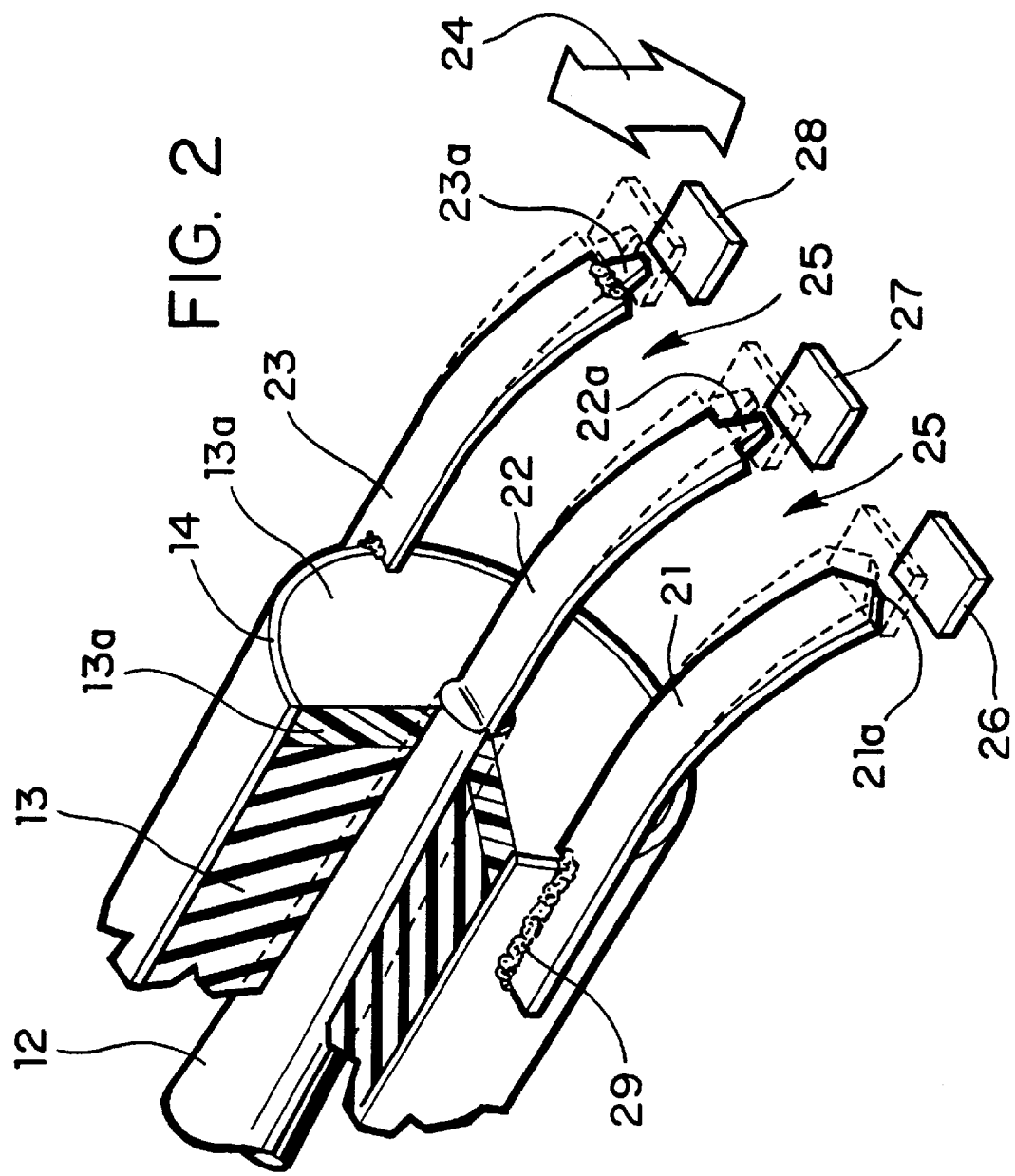

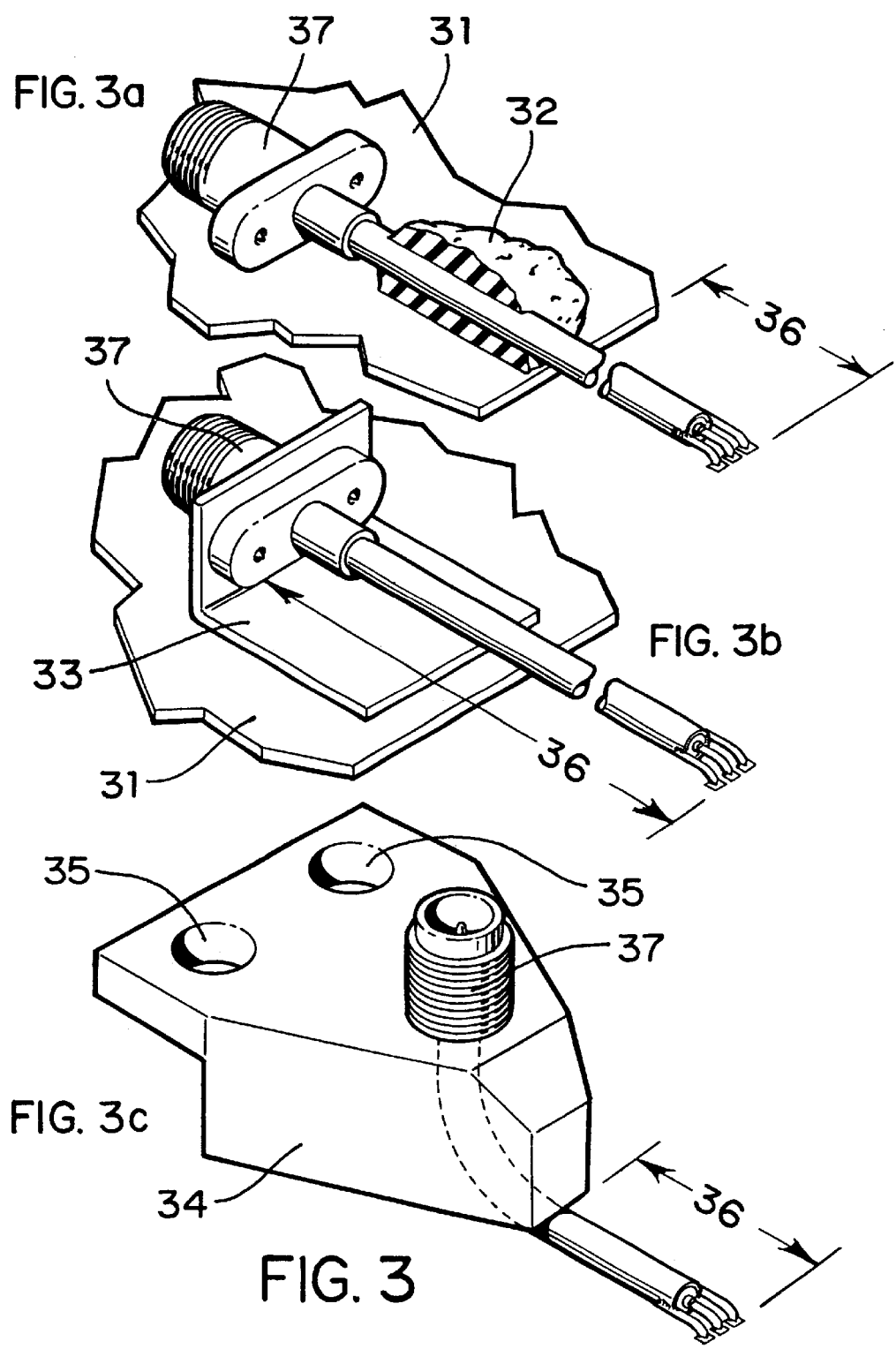

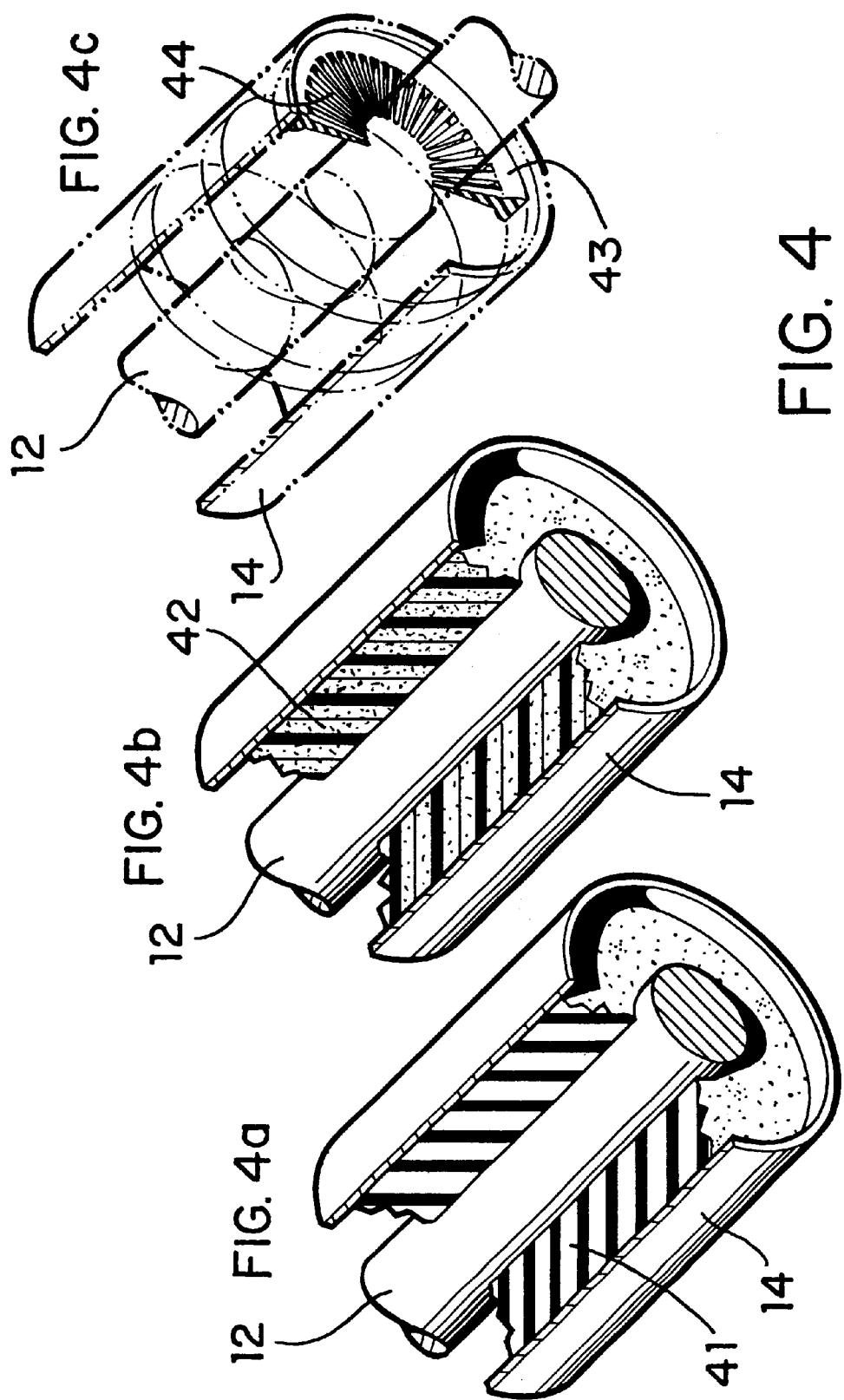

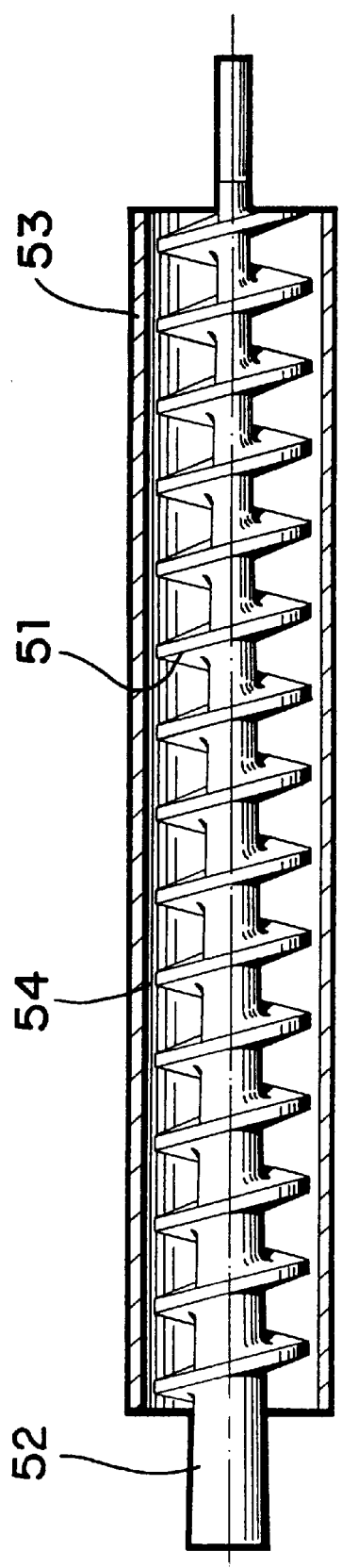
FIG. 5a
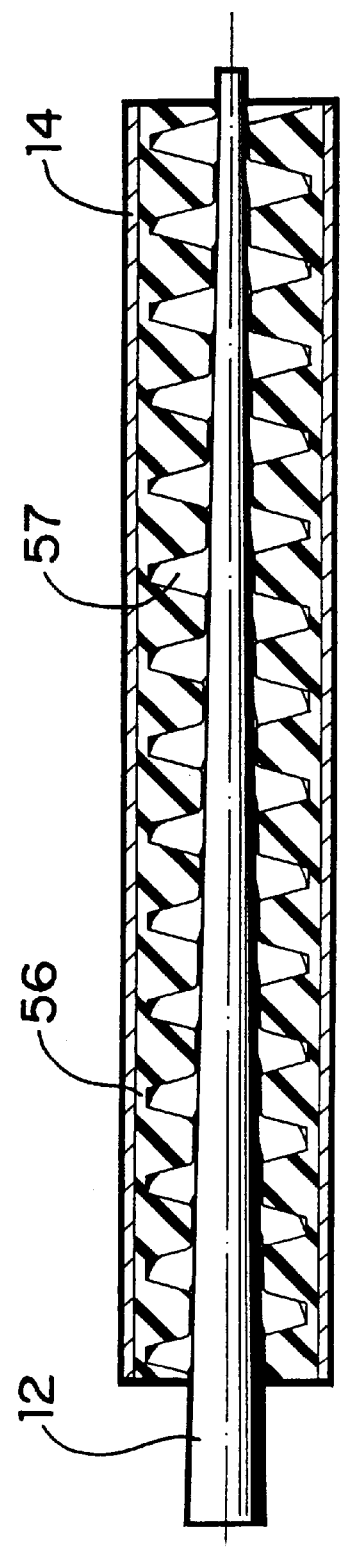
FIG. 5b
FIG. 5

BROADBAND IMPEDANCE MATCHING PROBE

FIELD OF THE INVENTION

This invention generally relates to a probe device for testing integrated circuits such as amplifiers, signal processors, mixers, filters, and analog to digital converters. The probe device may be employed for testing integrated circuits before separation from the semiconductor wafer, after separation, after the circuit has been placed into a package or after insertion into a circuit board. In general, the probe device is intended to transfer signals to and from a circuit during testing and to provide an impedance transformation to match the circuit impedance to that of the test instruments.

BACKGROUND OF THE INVENTION

Testing of integrated circuits (IC's), also called chips or dies, is an important part of the design and manufacture of the circuits. Initial testing is usually performed while the chips are still held together as parts of a semiconductor slice or wafer. Such testing requires a microprobe device that contacts the test pads on the chip and provides connections to the instruments employed for testing the circuits. Standard testing instruments for such circuits operate at a 50 ohm impedance level. Most integrated circuits operate at impedance levels that differ from 50 ohms. The impedance mismatch between the integrated circuit and the testing instruments makes accurate testing difficult and in some cases impossible. Fortunately methods for impedance matching are very well known in the electrical engineering art. There are reactive networks described for example on pages 206 to 215 of The Radio Engineer's Handbook by Terman, McGraw-Hill, 1943 (Reference 1). Another reference is Radio Engineering, third edition by Terman, McGraw-Hill, 1947 (Reference 2) where pages 100 to 104 describe the same reactive networks referred to above and pages 104 to 109 describe transmission line methods including tapered transmission lines, quarter wave matching sections and shorted stubs. A third reference is The ARRL Antenna Book, Published by The American Radio Relay League, Newington, Conn., 1994. The use of transformers to match impedances is also well known.

Another testing difficulty occurs when the chip to be tested has balanced input or output circuits. This presents a problem because the testing instruments are almost universally unbalanced with system ground on the external shield of 50 ohm coaxial cables and with the test signals on the center conductors. Fortunately circuits to convert from balanced to unbalanced modes (commonly referred to as Baluns) are also well known. See for example page 690 of the reference 2 above, and pages 26-9 to 26-13 of Ref. 3. Although application of the techniques of impedance matching are well known, particular structures for implementing those techniques in ways that are advantageous in the microprobing environment may not be obvious.

This specification describes an impedance matching probe employing a tapered transmission line that includes mechanically resilient contacting tips and structures to allow impedance matching over a broad frequency range and large impedance ratios.

OBJECTS OF THE INVENTION

This invention is directed toward probe apparatus for matching unequal impedances over a broad frequency range. A coaxial transmission line (cable) having a cylindrical center conductor separated from a surrounding outer conductor by an insulator has dimensions that provide an impedance to match a first impedance at a first end of the line and a different impedance to match a second impedance at a second end of the line. Mechanically resilient electrically conducting structures on the first end of the line are adapted to contact a device to be tested and a connector structure on the second end of the line is adapted to connect with test instruments. The insulator between the inner and outer conductors may be air, a solid dielectric, a dielectric foam, a dielectric powder or a more complicated dielectric structure.

BRIEF DESCRIPTION OF THE DRAWINGS

FIG. 1 shows three different probe bodies. FIG. 1a has a tapered inner conductor, FIG. 1b, a tapered outer conductor and FIG. 1c both tapered inner and outer conductors.

FIG. 2 shows the details of the probe tip structure.

FIGS. 3a, 3b and 3c show alternate methods for mounting the probe.

FIGS. 4a, 4b and 4c shows alternate types of insulators.

FIG. 5a shows a form for molding a particular insulator structure.

FIG. 5b shows the resulting insulator installed in a probe body.

DETAILED DESCRIPTION

FIG. 1a shows a cross-sectional drawing of a probe body that consists of a coaxial line with a center or inner conductor 12 surrounded by an insulating layer 13 which in turn is surrounded by an electrically conducting, uniform diameter shield 14. Insulator 13 may be air, solid dielectric or foam or a more complex structure that will be described later. To provide impedance matching, the diameter of the center conductor 12 is tapered so that the diameter is larger at one end of the probe body than at the other. Alternatively, the inner conductor may be uniform in diameter and the outer shield may be tapered as shown in FIG. 1b, or both inner conductor and outer shield may be tapered as shown in FIG. 1c. The inner conductor 12 extends out beyond the end of the shield 14 and the insulating layer 13 at the right and is suitably shaped to make contact with a device to be tested, also called a device under test (DUT). An electrical connector may be attached to the left end of the coaxial line for connection to testing instruments. Alternatively, connection to the test instruments may be made by connection to a coaxial line or a strip line or a coplanar line or other transmission line that then connects to the test instruments. The dimensions of the tapered coaxial line at the connector end are chosen to provide the desired impedance match to the testing instruments. The probes depicted in FIGS. 1a, 1b and 1c would transform a higher impedance at the DUT on the right to a lower impedance (usually 50 ohms) at the left end that connects to the test instruments. To transform a lower impedance at the tips, the spacing between the inner conductor and the outer shield would be smaller at the tip end than at the connector end. The tapered line structures shown in FIGS. 1a, 1b and 1c are inherently broad band and can match impedances over a much wider frequency range than other impedance matching structures. Such tapered line structures are useful only above a cutoff frequency that depends on the length of the line, the impedance ratio at the two ends and the form of the taper. Although the drawings show a linear taper, a nonlinear taper of the proper type provides additional advantages. In particular, a taper that yields an impedance that varies exponentially along the length of the line affords the largest bandwidth for any probe length and impedance ratio. (see reference 1, page 197)

FIG. 2 shows the details of the probe extensions that make contact with the DUT. The solid and dashed lines in FIG. 2 indicate the position of the probe tips and the DUT before and after making electrical contact. Electrical conductors 21 and 23 are mechanically and electrically connected to the shield 14 and are arranged to extend beyond the end of shield 14 and are also suitably shaped to make contact with the DUT. Advantageously, 21 and 23 should be mechanically resilient in the vertical direction as indicated by the double arrow 24 to allow for unavoidable variations in the vertical placement of the tip ends 21 and 23 and to allow for unavoidable variations in the tilt of the DUT. Advantageously, the spacing 25 between 21 and 23 and the center conductor extension 22 should be set so that the impedance of the tip structure matches the impedance of the coaxial line at the connection between the tips and the coaxial line. An additional increase or decrease in impedance at the DUT may be achieved by increasing or decreasing the spacing 25 toward the tips that touch the DUT. In addition, 21, 22 and 23 should be relatively rigid in the horizontal directions so that the tip spacing is held fixed during probing and the contacting points of 21, 22 and 23 may be placed accurately near the center of the contact pads 26, 27 and 28 of the DUT. For these reasons, although conductors 21, 22 and 23 could be ordinary needles, advantageously they may be formed as thin sheets tapering to a small contacting point. The contacting points may have small flattened surfaces where they meet the DUT so the points do not damage the contact pads 26, 27 and 28. The center conductor extension 22 may also be thinned as shown to form a mechanically resilient tip or it may be formed into a more rigid shape. As described in our U.S. Pat. No. 4,871,964, with the more rigid center conductor, 21 and 23 are offset vertically with respect to the center conductor so that as the DUT is raised the contact points of 21 and 23 make contact to the DUT before the center conductor does. As the DUT is raised further, 21 and 23 flex to then allow the center conductor to make contact with the DUT. As the DUT is raised further ("overprobing" in testing jargon) the probe body (the coaxial line) flexes to limit the forces applied to the probe pads of the DUT. Also, although the conductor 22 in FIG. 2 is illustrated as one piece with inner conductor 12, 22 may be made of a different conducting material and attached to 12 by suitable bonding, brazing or other method. Although two contacting elements 21 and 23 are shown in FIG. 2, it is to be understood that only one tip is necessary to connect the shield 14 to the DUT. The double connection is advantageous in that the two elements 21 and 23 partially shield the signal on the inner conductor extension 22 to reduce radiation and capacitive and magnetic coupling to other parts of the DUT and the surrounding space. The tips that make contact with the probe pads of the DUT may be simply tapered as indicated by 21a. Alternatively, the tip portion may be narrowed and bent downward as indicated by 22a. The advantage of this type of tip is that as the tip wears during use, the contact area remains substantially constant. An additional type of contacting tip indicated by 23a is a short pillar of material different from that of the spring structure 23 and welded, brazed or soldered to 23. Such a contacting tip may be advantageous for probing difficult to contact DUTs such as those employing aluminum metalization for the probe pads 26, 27 and 28.

The contact elements 21 and 23 may be formed separately and attached to the shield 14 by slitting shield 14 and soldering, brazing or welding as indicated by the fillet 29, or they may be attached in a variety of other ways such as simply attaching without slitting the shield or by sectioning a short length of the probe body to form a shelf on which the tip structures are then fastened as indicated in U.S. Pat. No. 5,506,515. The tips may also be held by a membrane and attached as indicated in U.S. Pat. No. 4,894,612. In addition, the tip structures 21 and 23 may be fashioned from the shield material itself by metal forming methods.

When the insulator 13 is a non-rigid material such as to be described in connection with FIGS. 4 and 5, it may be necessary to include a rigid electrically insulating insert 13a at the tip end as indicated in FIG. 2. Otherwise the stress on the inner conductor resulting from the force of the probe tip contacting the DUT may force the inner conductor 12 away from its proper position inside the outer shield 14. A short section of inner conductor 12 may have a reduced diameter so that the rigid insert 13a and the reduced diameter section of the inner conductor 12 form a short section of transmission line that matches the impedance of the probe body where it meets the insert 13a. The rigid insert 13a may be manufactured separately and inserted into the probe body or it may be formed in place by flowing a liquid insulator into the space and allowing it to harden.

As shown in FIG. 3a, the probe device may be mounted on a probe card 31 by soldering or adhesive fastening 32 or as shown in FIG. 3b by mounting via a bracket 33. Alternatively the probe device may be mounted alone or with other probe devices on a separate holder or bracket 34 that may be mounted on a standard probe station via mounting holes 35 as shown in FIG. 3c. These mountings may or may not include a standard connector 37 to facilitate connection to the test instruments.

The distance 36 between the probe tips and the probe mounting is chosen to provide the proper mechanical stiffness so that as the DUT is raised and the tips make contact with the DUT, the probe body, which is the coaxial line, may flex and the proper probing forces are exerted between the contacting tips and the probe pads of the DUT.

Details of the probe construction are shown in FIG. 4. It is advantageous that the inner conductor 12 be held securely in a fixed position inside the shield 14. One method FIG. 4a is to hold the inner conductor in its proper position while an insulator 41 in liquid form is flowed into the space between the inner and outer conductors. The insulator may be liquified by heating and then solidified by cooling or it may be a thermosetting compound that is liquid at ordinary temperature and solidifies as the result of chemical changes. An alternative method FIG. 4b is to fill the space with a fine, electrically insulating powder 42, or the inner conductor may be wrapped with a tape or thread made from solid or foamed or fibrous material. In other methods FIG. 4c an insulating filament or tape of more complex structure may be wrapped around the inner conductor or a series of insulating toroids may be placed at intervals over the inner conductor. The filament or toroids may be held in place by adhesive or by grooves cut into the outer or the inner conductor. Advantageously, the filament, tape or toroids may have a structure as indicated in FIG. 4c. The thin fingers or fibers are flexible so that although the ends of the thin fingers extend inward to a smaller diameter than that of the inner conductor 12, the fingers flex to allow the insertion of the center conductor into the shield 14. A particularly simple way of providing an insulator similar to that shown in FIG. 4c is to manufacture a fine cloth such as velvet with a relatively long nap. A rectangle of the proper size and shape can then be cut from the material, rolled up and inserted into the shield 14 with the nap inward. The inner conductor 12 can then be inserted by forcing the ends of the nap to spread. The materials of the cloth should have low electrical loss and the nap should be mechanically stable to keep the inner conductor in a fixed position inside the shield 14.

The insulator may also be formed separately in a mold, removed from the mold and then inserted into shield 14 after which the inner conductor 12 is inserted into the insulator. If the insulating material is an elastic foam, the hole to receive the inner conductor may be undersize so that as the inner conductor is inserted, the hole spreads, securely grasping the inner conductor.

A more complicated insulator structure may also be molded as indicated by the cross-sectional drawing of FIG. 5*a*. Here, a screw-shaped inner portion 51 of the mold has a core 52 that is tapered to correspond with the taper of the inner conductor of the coaxial probe. A sleeve 53 forms the outside of the mold with a space 54 between the inside surface of the sleeve 53 and the outside of the screw-shaped inner portion 51. With 51 and 53 held in place, an insulating material in liquid form is injected into the space between 51 and 53. After the insulator has solidified, the insulator is removed from the mold by turning (unscrewing) 51 out of the insulator and then removing the insulator from the inside of 53. The insulator is then inserted into the shield 14 of the probe and the inner conductor 12 is inserted as shown in FIG. 5*b*. The space 57 is air filled and therefore has a lower dielectric constant than the insulating material. Advantageously, the space 54 (FIG. 5*a*) which gives rise to the insulating web 56 that holds the insulator together in one piece should be as large as possible at the large end of center conductor 12. This produces the smallest air space and produces the lowest possible impedance at the low impedance end of the probe (on the left) because the dielectric constant of the insulator is larger than that of air. At the high impedance end of the probe (on the right), a large fraction of the space is filled with air so the impedance there is larger than it would be if the space were filled with insulator. Therefore, this strategy allows the largest impedance ratio for a given ratio of large to small diameters of the center conductor 12. Similar insulator structures may be constructed to provide an insulator for the probe bodies shown in FIGS. 1*b* and 1*c*.

Although we have only described the preferred embodiments of our invention, those skilled in the art may devise variations that do not significantly differ from the spirit and scope of our invention. For example, although we have indicated a straight probe body, the body could be curved or even coiled in order to fit the probe into a smaller space. The outside surface of 12 and/or the inside surface of 14 may be plated with a thin coating of highly electrically conductive metal to reduce the electrical losses in the probe. Throughout the figures we have indicated axially symmetric structures with circular crossection whereas any combination of square, rectangular, oval or other forms could be employed for either or both the inner or outer conductors. Also, it is not necessary for the inner conductor to be in the geometric center of the outer conductor but may be offset if required. In cases where the DUT presents an impedance that is not entirely resistive, that is one that includes a reactive component, an appropriate capacitive or inductive element may be included in the tip structure or at the connection to the test instruments to provide the proper conjugate match. In FIG. 2, the probe pads 26, 27 and 28 are shown as residing in a common plane. It is obvious that in a situation where the probe pads of the DUT are significantly nonplanar, for example with stripline, the tip structures 21, 22 and 23 may be displaced vertically to accommodate the non-planar configuration of the DUT. Furthermore, in the place of or in addition to the tip structures 21 and 23, a separate probe needle may be employed and connected to the outer conductor 14 with a low inductance conductor in a manner analogous to that described in FIG. 2 of our U.S. Pat. No. 5,373,231.

We claim:

1. A broad band impedance matching probe for testing electronic devices having a first end adapted for contacting a device to be tested, a second end adapted for connection to test instruments, a probe body having an inner electrical conductor, said inner electrical conductor being surrounded by an insulator, said insulator being surrounded by an electrically conducting shield, said inner conductor is tapered along the length of the probe body to provide an impedance that transforms the impedance of the test instruments at said second end to a different impedance at said first end, wherein said second end constitutes means for connection to said test instruments by the use of a coaxial connector.

2. A broad band impedance matching probe as recited in claim 1 in which said tapered inner conductor at said first end extends beyond said insulator and said shield and has means for making contact with the device to be tested.

3. A broad band impedance matching probe as recited in claim 2 in which a portion of said extension of said inner conductor is thinned to render the said extension mechanically resilient when contacting the device under test.

4. A broad band impedance matching probe as recited in claim 1 in which an electrically conducting extension or portion of said shield constitutes means for contacting said device to be tested.

5. A broad band impedance matching probe as recited in claim 4 in which said electrically conducting extension is thinned to render the said extension mechanically resilient when contacting said device under test.

6. A broad band impedance matching probe for testing electronic circuits having means on a first end for contacting a device to be tested, a second end having means for connection to test instruments, a probe body with an inner electrical conductor, said inner conductor being surrounded by an insulator, said insulator being surrounded by an electrically conducting shield, said shield having an inside dimension that is tapered along the length of the probe body to provide an impedance that transforms the impedance of the test instruments at said second end to a different impedance at said first end.

7. A broad band impedance matching probe as recited in claim 6 in which said inner electrical conductor at said first end extends beyond said insulator and said shield and has means for making contact with the device to be tested.

8. A broad band impedance matching probe as recited in claim 6 in which a portion of said extension of said inner conductor is thinned to render said extension mechanically resilient when contacting the device to be tested.

9. A broad band impedance matching probe according to claim 6 in which an electrically conducting extension of said shield has means for contacting said device to be tested.

10. A broad band impedance matching probe according to claim 9 in which said electrically conducting extension is thinned to render said extension mechanically resilient when contacting said device to be tested.

11. A broad band impedance matching probe according to claim 6 in which said second end has means for connection to said test instruments by attachment of a coaxial connector.

12. A broad band impedance matching probe according to claims 1 or 6 in which said insulator is an insulating filament wrapped around said center conductor.

13. A broad band impedance matching probe according to claims 1 or 6 in which said insulator is a solid dielectric.

14. A broad band impedance matching probe according to claims 1 or 6 in which said insulator is a molded structure with a solid dielectric at the outer periphery and at least a part of the inner portion being an insulating rib to hold said inner conductor in a fixed position inside said outer shield.

15. A broad band impedance matching probe according to claims 1 or 6 in which said insulator has the form of a multitude of fibers extending inwardly from the inside of said shield and said fibers contact said inner electrical conductor to retain said inner electrical conductor in substantially a fixed position inside said shield.

16. A broad band impedance matching probe according to claims 1 or 6 in which said inner conductor is held in a fixed position inside said shield by a short section of rigid insulating material at one end thereof.

17. A broad band impedance matching probe according to claims 1 or 7 in which said insulator is a foam dielectric material.

* * * * *